United States Patent
Bandic et al.

(10) Patent No.: US 10,133,625 B2
(45) Date of Patent: Nov. 20, 2018

(54) STORING PARITY DATA SEPARATE FROM PROTECTED DATA

(71) Applicant: Western Digital Technologies, Inc., Irvine, CA (US)

(72) Inventors: Zvonimir Z. Bandic, San Jose, CA (US); Robert E. Mateescu, San Jose, CA (US); Seung-Hwan Song, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 42 days.

(21) Appl. No.: 14/823,796

(22) Filed: Aug. 11, 2015

(65) Prior Publication Data

US 2017/0046221 A1 Feb. 16, 2017

(51) Int. Cl.
| | |
|---|---|
| *G06F 11/10* | (2006.01) |
| *G11C 29/52* | (2006.01) |
| *G11C 29/04* | (2006.01) |
| *G11C 29/44* | (2006.01) |

(52) U.S. Cl.
CPC .......... *G06F 11/1044* (2013.01); *G11C 29/52* (2013.01); *G11C 2029/0411* (2013.01); *G11C 2029/4402* (2013.01)

(58) Field of Classification Search
CPC .. G06F 11/1068; G06F 11/10; G06F 11/1012; G11C 29/52; G11C 2029/0411
See application file for complete search history.

(56) References Cited

U.S. PATENT DOCUMENTS

| | | | |
|---|---|---|---|
| 7,818,525 B1 | 10/2010 | Frost et al. | |
| 8,601,347 B1 | 12/2013 | Koseki et al. | |
| 8,621,318 B1 | 12/2013 | Micheloni et al. | |
| 8,769,374 B2 | 7/2014 | Franceschini et al. | |
| 9,262,268 B2 * | 2/2016 | Cai | G06F 11/108 |
| 2008/0212352 A1 * | 9/2008 | Oh | G11C 5/02 365/51 |

(Continued)

FOREIGN PATENT DOCUMENTS

| | | |
|---|---|---|
| AU | 2016213809 A1 | 3/2017 |
| GB | 2541299 A | 2/2017 |

(Continued)

OTHER PUBLICATIONS

Bertozzi et al., "Performance and Reliability Analysis of Cross-Layer Optimizations of NAND Flash Controllers," ACM Transaction on Embedded Computing Systems, vol. 14, Issue 1, Jan. 2015, 25 pp.

(Continued)

*Primary Examiner* — Kyle Vallecillo
(74) *Attorney, Agent, or Firm* — Patterson & Sheridan, LLP; Steven Versteeg

(57) ABSTRACT

A storage device may include a primary storage array comprising a plurality of memory devices, one or more parity memory devices, and a controller configured to store a block of data. The controller may be configured to store the block of data by at least: writing the block of data to the primary storage array, determining parity data for the block of data, and writing at least a portion of the determined parity data to the one or more parity memory devices.

15 Claims, 7 Drawing Sheets

(56) References Cited

U.S. PATENT DOCUMENTS

| | | | |
|---|---|---|---|
| 2009/0313617 A1* | 12/2009 | Hung | G06F 11/1092 717/168 |
| 2010/0122148 A1 | 5/2010 | Flynn et al. | |
| 2010/0131828 A1* | 5/2010 | Kwon | G06F 11/1008 714/764 |
| 2011/0239088 A1 | 9/2011 | Post | |
| 2011/0252288 A1 | 10/2011 | Sharon et al. | |
| 2011/0320915 A1 | 12/2011 | Khan | |
| 2012/0254694 A1 | 10/2012 | Golov et al. | |
| 2013/0024605 A1* | 1/2013 | Sharon | G06F 11/1072 711/103 |
| 2013/0139030 A1 | 5/2013 | Okubo et al. | |
| 2013/0246887 A1 | 9/2013 | Torii et al. | |
| 2013/0279249 A1 | 10/2013 | Yun et al. | |
| 2014/0032992 A1* | 1/2014 | Hara | G06F 12/0246 714/773 |
| 2014/0136927 A1 | 5/2014 | Li et al. | |
| 2014/0149826 A1 | 5/2014 | Lu et al. | |
| 2014/0160857 A1 | 6/2014 | Oh et al. | |
| 2015/0154066 A1 | 6/2015 | Grimsrud et al. | |
| 2015/0309744 A1 | 10/2015 | Takeuchi et al. | |
| 2015/0339187 A1* | 11/2015 | Sharon | G11C 29/52 714/766 |
| 2016/0240252 A1* | 8/2016 | Oh | G11C 13/0069 |
| 2016/0283143 A1* | 9/2016 | Guo | G06F 3/0619 |
| 2017/0079050 A1 | 3/2017 | Lee et al. | |

FOREIGN PATENT DOCUMENTS

| | | |
|---|---|---|
| JP | H5-326871 A | 12/1993 |
| JP | 2013-130899 A | 7/2013 |
| JP | 2013-225830 A | 10/2013 |
| JP | 2017079050 A | 4/2017 |
| KR | 10-2015-0079917 A | 7/2015 |
| WO | 2014/083811 A1 | 6/2014 |
| WO | 2014083811 A1 | 6/2014 |

OTHER PUBLICATIONS

Search and Examination Report from counterpart British Application No. GB1613647.5, dated Sep. 28, 2016, 6 pp.
Office action for Canadian Patent Application No. 2,938,584 dated Mar. 13, 2017.
Office action for United Kingdom Patent Application No. GB1613647.5 dated Sep. 28, 2016.
Office Action for Australian Patent Application No. 2016213809 dated Mar. 6, 2017.
Korean Office Action (with attached English translation) for Application No. 10-2016-0102536; dated Aug. 25, 2017; 7 total pages.
Japanese Office Action (with attached English translation) for Application No. 2016-157672; dated Dec. 26, 2017; 7 total pages.
Examination Search Report issued in corresponding Canadian Patent Application No. 2,938,584, dated Feb. 20, 2018 (4 pages).
Office Action issued in corresponding Japanese Patent Application No. 2016-157672, dated May 8, 2018 (8 pages).

* cited by examiner

STORING PARITY DATA SEPARATE FROM PROTECTED DATA

TECHNICAL FIELD

This disclosure relates to memory management, and more particularly, to allocating parity data in a storage device.

BACKGROUND

Memory devices used in computers or other electronics devices may be non-volatile memory or volatile memory. The main difference between non-volatile memory and volatile memory is that non-volatile memory may continue to store data without requiring a persistent power supply. As a result, non-volatile memory devices have developed into a popular type of memory for a wide range of electronic applications. For instance, non-volatile memory devices, including flash memory devices, are commonly incorporated into solid-state storage devices, such as solid-state drives (SSDs).

In some examples, when writing data to the non-volatile memory devices, a controller may perform one or more operations to protect the data from memory errors. For instance, in addition to writing the data to the non-volatile memory devices, a controller may generate and write parity data to the memory device that may be used to restore the data, such as in the event of a memory error.

SUMMARY

In one example, storage device includes a primary storage array comprising a plurality of memory devices, one or more parity memory devices, and a controller configured to store a block of data. In this example, the controller is configured to store the block of data by at least writing the block of data to the primary storage array, determining parity data for the block of data, and writing at least a portion of the determined parity data to the one or more parity memory devices.

In another example, a method includes writing, by a controller of a storage device, a block of data to a primary storage array comprising a plurality of memory devices, determining, by the controller, parity data for the block of data, and writing, by the controller, the determined parity data to one or more parity memory devices.

In another example, a computer-readable storage medium stores instructions that, when executed, cause one or more processors of a storage device to: write a block of data to a primary storage array comprising a plurality of memory devices, determine parity data for the block of data, and write the determined parity data to one or more parity memory devices.

In another example, a system includes a primary storage array comprising a plurality of memory devices, one or more parity memory devices, means for writing a block of data to the primary storage array, means for determining parity data for the block of data, and means for writing the determined parity data to one or more parity memory devices.

The details of one or more examples are set forth in the accompanying drawings and the description below. Other features, objects, and advantages will be apparent from the description and drawings, and from the claims.

DETAILED DESCRIPTION

Figure 1:
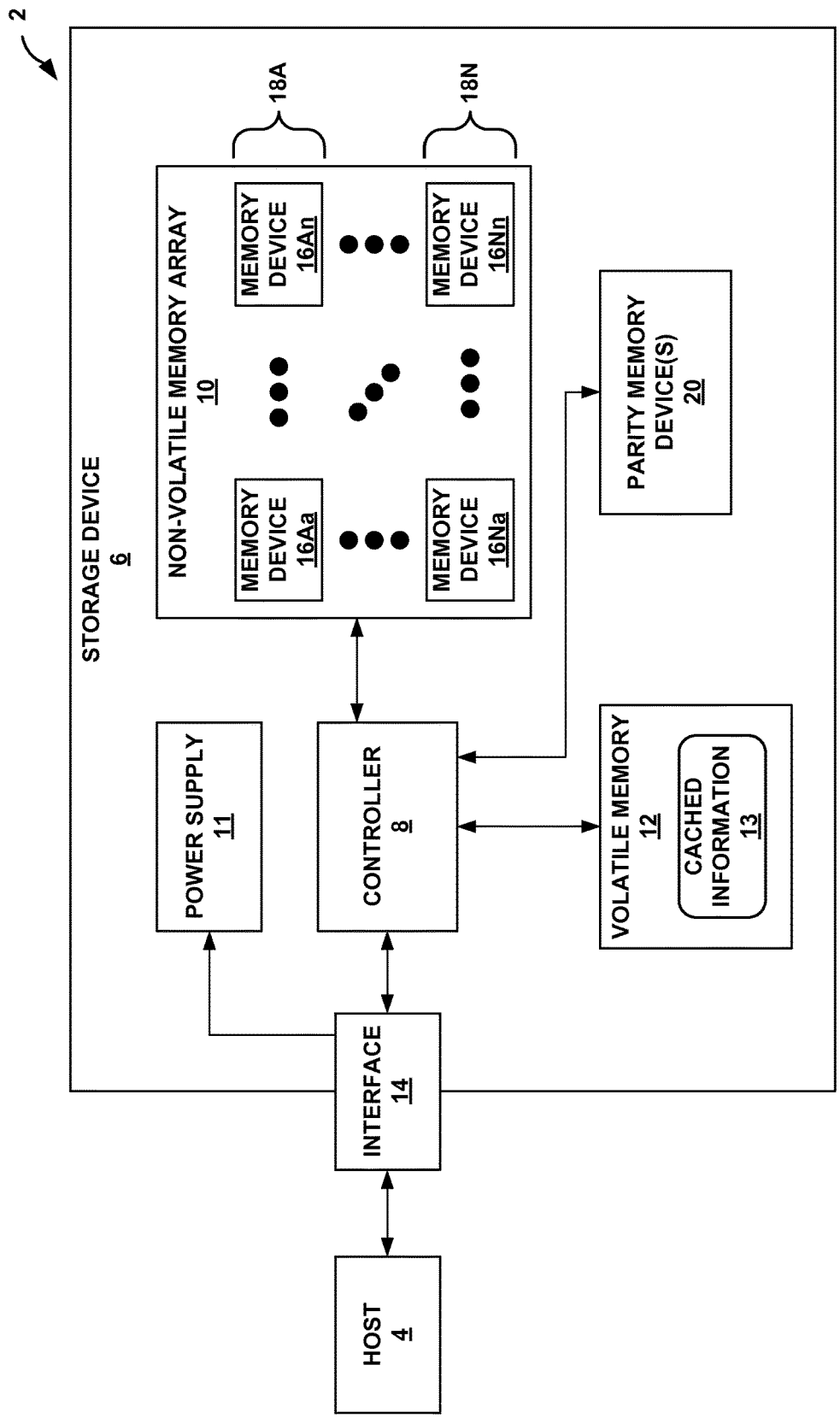
FIG. 1 is a conceptual and schematic block diagram illustrating an example storage environment in which a storage device may function as a storage device for a host device, in accordance with one or more techniques of this disclosure

This disclosure describes a storage device that includes a controller that is configured to store user data in a primary memory device and store at least some error correcting code (ECC) parity data associated with the user data in a parity memory device. By storing at least some ECC parity data in a parity memory device, a greater amount of storage may be used by ECC parity data, which may allow stronger ECC parity techniques, better protecting integrity of the user data. In comparison, in some storage devices, the size of the ECC parity data may be limited to the difference between the size of a block of user data and the size of the physical page of the memory device. For instance, where a physical page in a memory device includes 8320 bytes and the size of the block of user data is 8192 bytes, the size of the parity data may be limited to 128 bytes. Storing at least some ECC parity data in the parity memory device also may facilitate flexible ECC strength, e.g., increasing the amount of ECC parity data as the age of the storage device increases.

Further, storing at least some ECC parity data in a parity memory device may reduce read accesses of the primary memory device compared to utilizing multiple pages of data within the primary memory device to store ECC parity information. In some examples, such as where a controller uses an advanced logical-to-physical address mapping scheme, the size of the parity data used by the controller may be made independent of the size of physical pages of the memory device. In particular, the controller may allocate multiple physical page addresses to store the parity data. In this way, a controller may use higher ECC strengths. However, as a portion of the parity data is stored in a separate page of the memory device than the user data, the controller may need to read both the first physical page and the second physical page in order to retrieve the user data. Similarly, when storing the user data, the controller may need to write to two different physical addresses in the memory device, which may not be desirable (e.g., due to increased cycle counts, reduced performance, reduced reliability, and increased read disturbance). Reducing read and write accesses of the primary memory device may reduce wear and prolong a life of the primary memory device.

In accordance with one or more techniques of this disclosure a controller may store at least a portion of the ECC parity data in a separate parity memory device. For instance, a controller may determine parity data associated with a block of user data, store the block of user data in a primary memory device, and store at least a portion of the parity data in a parity memory device that is separate from the primary memory device. In some examples, the controller may write the at least a portion of the parity data to the parity memory device and write the block of user data to the primary memory device in parallel. Similarly, in some examples, the controller may read the at least a portion of the parity data from the parity memory device and read the block of user data from the primary memory device in parallel. In this way, the controller may use larger sizes of parity data without significantly reducing performance.

In some examples, the parity memory device may be the same type of memory device as the primary memory device. For instance, in some examples, both the parity memory device and the primary memory device may be NAND flash memory devices, but may be separately addressable by the controller. However, the size of the parity data may be significantly smaller than the size of the user data; therefore, the size of the parity memory device may be significantly smaller than the size of the primary memory device. For instance, the size of the parity data stored in the parity memory device may be less than one-tenth the size of the user data stored in the primary memory device.

In accordance with one or more techniques of this disclosure, a storage device may include a primary memory device and a parity memory device that is a different type of memory device than the primary device. In some examples, the primary storage device may be a NAND flash memory device and the parity memory device may be a storage class type of memory device, such as a magnetoresisitve random-access memory (MRAM) device, a phase-change random-access memory (PRAM) device, or a resistive random-access memory (ReRAM) device. As compared to some flash memory devices (e.g., NAND flash memory devices), such storage class memory devices may have increased cost per bit and reduced latency (e.g., nanosecond vs. microsecond). As discussed above, the size of the parity data may be significantly smaller than the size of the user data. Therefore, the size of the parity memory device can be significantly smaller than the size of the primary memory device, which may make cost of the parity memory device less significant. Additionally, because the parity memory device may have a shorter latency than the primary memory device, the writing and reading of parity data to the parity memory device may take less time than the writing and reading of user data to the primary memory device. In this way, the controller may user larger sizes of parity data without significantly reducing performance.

FIG. 1 is a conceptual and schematic block diagram illustrating an example storage environment 2 in which storage device 6 may function as a storage device for host device 4, in accordance with one or more techniques of this disclosure. For instance, host device 4 may utilize non-volatile memory devices included in storage device 6 to store and retrieve data. In some examples, storage environment 2 may include a plurality of storage devices, such as storage device 6, which may operate as a storage array. For instance, storage environment 2 may include a plurality of storages devices 6 configured as a redundant array of inexpensive/independent disks (RAID) that collectively function as a mass storage device for host device 4.

Storage environment 2 may include host device 4 which may store and/or retrieve data to and/or from one or more storage devices, such as storage device 6. As illustrated in FIG. 1, host device 4 may communicate with storage device 6 via interface 14. Host device 4 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like.

As illustrated in FIG. 1 storage device 6 may include controller 8, non-volatile memory array 10 (NVMA 10), volatile memory 12, interface 14, and parity memory device(s) 20. In some examples, storage device 6 may include additional components not shown in FIG. 1 for sake of clarity. For example, storage device 6 may include a printed board (PB) to which components of storage device 6 are mechanically attached and which includes electrically conductive traces that electrically interconnect components of storage device 6; and the like. In some examples, the physical dimensions and connector configurations of storage device 6 may conform to one or more standard form factors. Some example standard form factors include, but are not limited to, 3.5" hard disk drive (HDD), 2.5" HDD, 1.8" HDD, peripheral component interconnect (PCI), PCI-extended (PCI-X), PCI Express (PCIe) (e.g., PCIe x1, x4, x8, x16, PCIe Mini Card, MiniPCI, etc.). In some examples, storage device 6 may be directly coupled (e.g., directly soldered) to a motherboard of host device 4.

Storage device 6 may include interface 14 for interfacing with host device 4. Interface 14 may include one or both of a data bus for exchanging data with host device 4 and a control bus for exchanging commands with host device 4. Interface 14 may operate in accordance with any suitable protocol. For example, interface 14 may operate in accordance with one or more of the following protocols: advanced technology attachment (ATA) (e.g., serial-ATA (SATA), and parallel-ATA (PATA)), Fibre Channel, small computer system interface (SCSI), serially attached SCSI (SAS), peripheral component interconnect (PCI), PCI-express, or Non-Volatile Memory Express (NVMe). The electrical connection of interface 14 (e.g., the data bus, the control bus, or both) is electrically connected to controller 8, providing electrical connection between host device 4 and controller 8, allowing data to be exchanged between host device 4 and controller 8. In some examples, the electrical connection of interface 14 may also permit storage device 6 to receive power from host device 4.

Storage device 6 may include NVMA 10, which may include a plurality of memory devices 16Aa-16Nn (collectively, "memory devices 16"). Each of memory devices 16 may be configured to store and/or retrieve data. For instance, a memory device of memory devices 16 may receive data and a message from controller 8 that instructs the memory device to store the data. Similarly, the memory device of memory devices 16 may receive a message from controller 8 that instructs the memory device to retrieve data. In some examples, each of memory devices 6 may be referred to as a die. In some examples, a single physical chip may include a plurality of dies (i.e., a plurality of memory devices 16). In some examples, each of memory devices 16 may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

Figure 2:
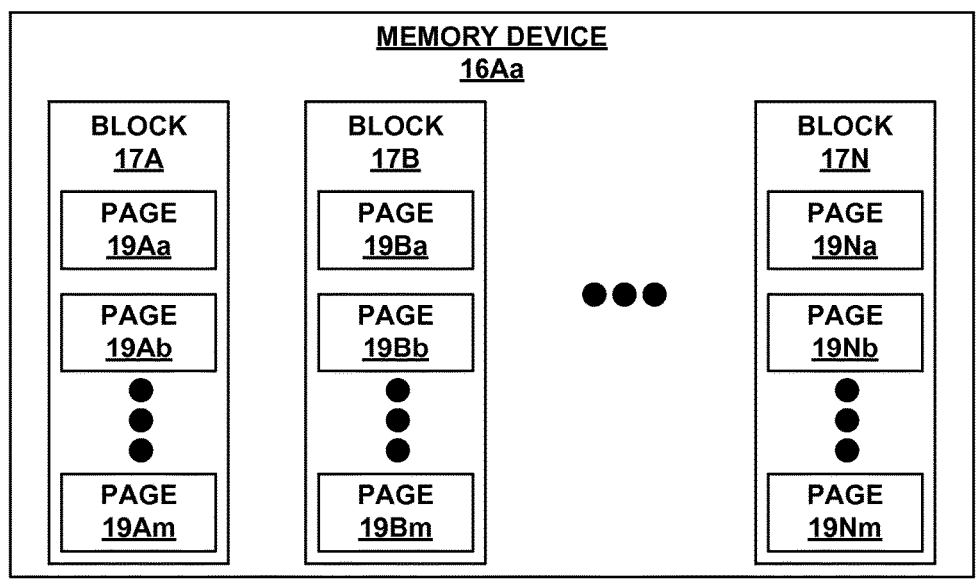
FIG. 2 is a conceptual block diagram illustrating an example memory device that includes a plurality of blocks, each block including a plurality of pages, in accordance with one or more techniques of this disclosure.

In some examples, memory devices 16 may include flash memory devices. Flash memory devices may include NAND or NOR based flash memory devices, and may store data based on a charge contained in a floating gate of a transistor for each flash memory cell. In NAND flash memory devices, the flash memory device may be divided into a plurality of blocks. FIG. 2 is a conceptual block diagram illustrating an example memory device 16Aa that includes a plurality of blocks 17A-17N (collectively, "blocks 17"), each block including a plurality of pages 19 Aa-19 Nm (collectively, "pages 19"). Each block of blocks 17 may include a plurality of NAND cells. Rows of NAND cells may be serially electrically connected using a word line to define a page (one page of pages 19). Respective cells in each of a plurality of pages 19 may be electrically connected to respective bit lines. Controller 8 may write data to and read data from NAND flash memory devices at the page level and erase data from NAND flash memory devices at the block level.

In some examples, memory devices 16 may include any type of non-volatile memory devices. Some examples, of memory devices 16 include, but are not limited to flash memory devices (e.g., NAND or NOR), phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

In some examples, it may not be practical for controller 8 to be separately connected to each memory device of memory devices 16. As such, the connections between memory devices 16 and controller 8 may be multiplexed. As an example, memory devices 16 may be grouped into channels 18A-18N (collectively, "channels 18"). For instance, as illustrated in FIG. 1, memory devices 16Aa-16An may be grouped into first channel 18A, and memory devices 16Na-16Nn may be grouped into $N^{th}$ channel 18N. The memory devices 16 grouped into each of channels 18 may share one or more connections to controller 8. For instance, the memory devices 16 grouped into first channel 18A may be attached to a common I/O bus and a common control bus. Storage device 6 may include a common I/O bus and a common control bus for each respective channel of channels 18. In some examples, each channel of channels 18 may include a set of chip enable (CE) lines which may be used to multiplex memory devices on each channel. For example, each CE line may be connected to a respective memory device of memory devices 18. In this way, the number of separate connections between controller 8 and memory devices 18 may be reduced. Additionally, as each channel has an independent set of connections to controller 8, the reduction in connections may not significantly affect the data throughput rate as controller 8 may simultaneously issue different commands to each channel.

Storage device 6 may include power supply 11, which may provide power to one or more components of storage device 6. When operating in a standard mode, power supply 11 may provide power to the one or more components using power provided by an external device, such as host device 4. For instance, power supply 11 may provide power to the one or more components using power received from host device 4 via interface 14. In some examples, power supply 11 may include one or more power storage components configured to provide power to the one or more components when operating in a shutdown mode, such as where power ceases to be received from the external device. In this way, power supply 11 may function as an onboard backup power source. Some examples of the one or more power storage components include, but are not limited to, capacitors, super capacitors, batteries, and the like.

Storage device 6 also may include volatile memory 12, which may be used by controller 8 to store information. In some examples, controller 8 may use volatile memory 12 as a cache. For instance, controller 8 may store cached information 13 in volatile memory 12 until cached information 13 is written to memory devices 16. As illustrated in FIG. 1, volatile memory 12 may consume power received from power supply 11.

Examples of volatile memory 12 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like).

Storage device 6 includes controller 8, which may manage one or more operations of storage device 6. For instance, controller 8 may manage the reading of data from and/or the writing of data to memory devices 16. In some examples, controller 8 may perform one or more operations to manage data stored by memory devices 16. For instance, controller 8 may perform one or more operations to ensure the integrity of data stored by memory devices 16, such as storing parity data for user data stored by memory devices 16. Additional details of controller 8 are discussed below with reference to FIG. 3.

In accordance with one or more techniques of this disclosure, storage device 6 may include one or more parity memory devices 20, which may be used by controller 8 to store at least some parity information. In some examples, parity memory devices 20 may include any type of non-volatile memory devices. Some examples of parity memory devices 20 include, but are not limited to, flash memory devices, such as NAND flash memory devices and/or NOR flash memory devices, storage class memory devices, holographic memory devices, and any other type of non-volatile memory devices. Some examples of storage class memory devices include, but are not limited to, phase-change memory (PCM) devices, resistive random-access memory (ReRAM) devices, magnetoresistive random-access memory (MRAM) devices, and ferroelectric random-access memory (F-RAM). In some examples, storage class memory devices may be byte-accessible, have relatively high endurance (comparable to or greater than flash memory), have relatively low write and read latency (e.g., lower than flash memory, in some examples comparable to DRAM).

As discussed above, controller 8 may cause memory devices 16, parity memory devices 20, or both to store parity data associated with user data stored by memory devices 16. For instance, when storing a block of user data, controller 8 may determine and store the exclusive-OR (XOR) of the block of user data with the user data. When retrieving the block of user data, controller 8 may read both the stored block of user data and the stored parity data associated with the block of user data and use the stored parity data to verify the block of user data. In some examples, controller 8 may store the parity data with the user data in the same physical page of a memory device. For instance, controller 8 may store parity data along with the user data in page 19Aa of block 17A of memory device 16Aa of FIG. 2.

The size of the parity data used by controller 8 may be referred to as the ECC strength. In some examples, a greater size of parity data may provide better protection against data corruption errors. However, as the size of the parity data increases, so does the amount of memory consumed by the parity data. In some examples, such as where controller 8 stores the parity data with the user data in the same physical page of the memory device, the size of the parity data may be limited to the difference between the size of a block of user data and the size of the physical page of the memory device. For instance, where a size of physical page 19Aa is 8320 bytes and the size of the block of user data is 8192 bytes, the size of the parity data that controller 8 may store in the same page as the user data may be limited to 128 bytes. However, in some examples, it may be desirable for controller 8 to store larger parity data than the limited size difference between the size of a block of user data and the size of the physical page of the memory device, e.g., to provide stronger protection against data corruption errors.

In some examples, controller 8 may make the size of the parity data independent of the size of physical pages of memory devices 16, the difference between the size of the physical pages of memory devices 16 and the size of the block of user data, or both. For instance, controller 8 may store the user data and at least some of the parity data at different physical pages within memory devices 16. As one example, controller 8 may store a first portion of the parity data along with the user data in page 19Aa of memory device 16Aa and store a second portion of the parity data in page 19Ab of memory device 16Aa. However, as the second portion of the parity data is stored in a separate page of memory devices 16 than the user data, controller 8 may need to read both pages (e.g., page 19Aa and page 19Ab) in order to retrieve and decode the user data. Similarly, when storing the user data, controller 8 may need to write to two different physical pages in memory devices 16, which may not be desirable (e.g., due to increased cycle counts, reduced performance, reduced reliability, and increased read disturbance). As another example, as opposed to storing the parity data at a different physical page than the corresponding user data within a memory device of memory devices 16, controller 8 may store at least a portion of the parity data in parity memory devices 20. For instance, controller 8 may determine parity data for a block of user data, store the block of user data in memory devices 16, and store at least a portion of the parity data in parity memory devices 20. In some examples, controller 8 may write the at least a portion of the parity data to parity memory devices 20 and write the block of user data to memory devices 16 in parallel. Similarly, in some examples, controller 8 may read the at least a portion of the parity data from parity memory device 20 and read the block of user data from memory devices 16 in parallel. In this way, controller 8 may use larger sizes of parity data without or with reduced undesirable effects (e.g., increasing cycle counts, reducing performance, reducing reliability, and increasing read disturbance).

Figure 3:
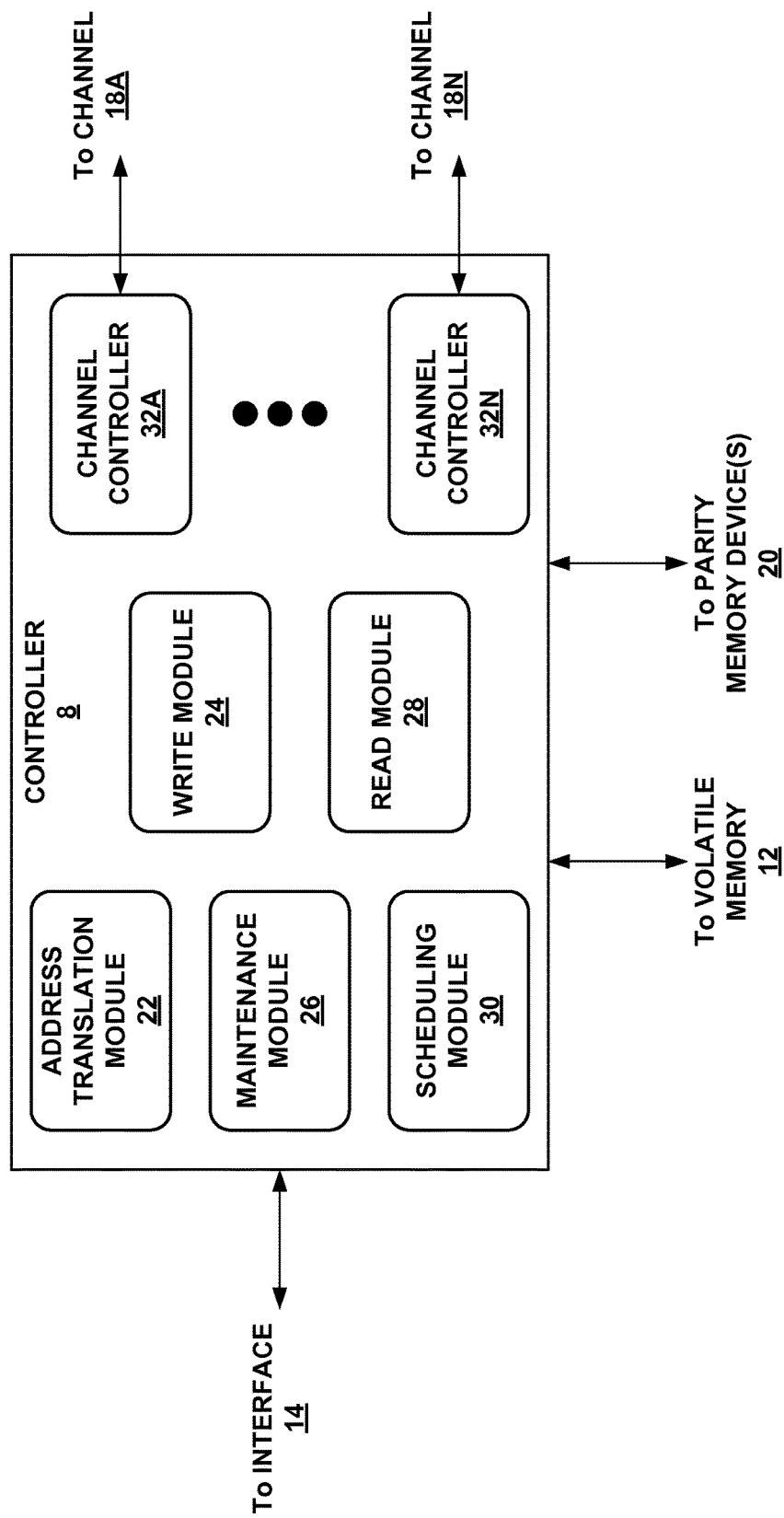
FIG. 3 is a conceptual and schematic block diagram illustrating example details of a controller, in accordance with one or more techniques of this disclosure.

FIG. 3 is a conceptual and schematic block diagram illustrating example details of controller 8. In some examples, controller 8 may include an address translation module 22, a write module 24, a maintenance module 26, a read module 28, a scheduling module 30, and a plurality of channel controllers 32A-32N (collectively, "channel controllers 32"). In other examples, controller 8 may include additional modules or hardware units, or may include fewer modules or hardware units. Controller 8 may include a microprocessor, digital signal processor (DSP), application specific integrated circuit (ASIC), field programmable gate array (FPGA), or other digital logic circuitry.

Controller 8 may interface with the host device 4 via interface 14 and manage the storage of data to and the retrieval of data from memory devices 16. For example, write module 24 of controller 8 may manage writes to memory devices 16. For example, write module 24 may receive a message from host device 4 via interface 14 instructing storage device 6 to store data associated with a logical address and the data, which may be referred to as user data. Write module 24 may manage writing of the user data to memory devices 16.

For example, write module 24 may communicate with address translation module 22, which manages translation between logical addresses used by host device 4 to manage storage locations of data and physical block addresses used by write module 24 to direct writing of data to memory devices. Address translation module 22 of controller 8 may utilize a flash translation layer or table that translates logical addresses (or logical block addresses) of data stored by memory devices 16 to physical block addresses of data stored by memory devices 16. For example, host device 4 may utilize the logical block addresses of the data stored by memory devices 16 in instructions or messages to storage device 6, while write module 24 utilizes physical block addresses of the data to control writing of data to memory devices 16. (Similarly, read module 28 may utilize physical block addresses to control reading of data from memory devices 16.) The physical block addresses correspond to actual, physical blocks of memory devices 16. In some examples, address translation module 22 may store the flash translation layer or table in volatile memory 12, such as within cached information 13.

In this way, host device 4 may be allowed to use a static logical block address for a certain set of data, while the physical block address at which the data is actually stored may change. Address translation module 22 may maintain the flash translation layer or table to map the logical block addresses to physical block addresses to allow use of the static logical block address by the host device 4 while the physical block address of the data may change, e.g., due to wear leveling, garbage collection, or the like.

As discussed above, write module 24 of controller 8 may perform one or more operations to manage the writing of data to memory devices 16. For example, write module 24 may manage the writing of data to memory devices 16 by selecting one or more blocks within memory devices 16 to store the data and causing memory devices of memory devices 16 that include the selected blocks to actually store the data. As discussed above, write module 24 may cause address translation module 22 to update the flash translation layer or table based on the selected blocks. For instance, write module 24 may receive a message from host device 4 that includes a unit of data and a logical block address, select a block within a particular memory device of memory devices 16 to store the data, cause the particular memory device of memory devices 16 to actually store the data (e.g., via a channel controller of channel controllers 32 that corresponds to the particular memory device), and cause address translation module 22 to update the flash translation layer or table to indicate that the logical block address corresponds to the selected block within the particular memory device.

Read module 28 similarly may control reading of data from memory devices 16. For example, read module 28 may receive a message from host device 4 requesting data with an associated logical block address. Address translation module 22 may convert the logical block address to a physical block address using the flash translation layer or table. Read module 28 then may control one or more of channel controllers 32 to retrieve the data from the physical block addresses. Similar to write module 24, read module 28 may select one or more blocks and communicate a message to channel controllers 32 that may cause channel controllers 32 to read the data from the selected blocks.

In order to write a bit with a logical value of 0 (charged) to a bit with a previous logical value of 1 (uncharged), a large current is used. This current may be sufficiently large that it may cause inadvertent changes to the charge of adjacent flash memory cells. To protect against inadvertent changes, an entire block of flash memory cells may be erased to a logical value of 1 (uncharged) prior to writing any data to cells within the block. Because of this, flash memory cells may be erased at the block level and written at the page level.

Thus, to write even an amount of data that would consume less than one page, controller 8 may cause an entire block to be erased. This may lead to write amplification, which refers to the ratio between the amount of data received from host device 4 to be written to memory devices 16 and the amount of data actually written to memory devices 16. Write amplification contributes to faster wearing of the flash memory cells than would occur with no write amplification. Wear to flash memory cells may occur when flash memory cells are erased due to the relatively high voltages used to erase the flash memory cells. Over a plurality of erase cycles, the relatively high voltages may result in changes to the flash memory cells. Eventually, the flash memory cells may wear out, such that data may no longer be written to the cells.

One technique that controller 8 may implement to reduce write amplification and wear of flash memory cells includes writing data received from host device 4 to unused blocks (e.g., blocks 17 of FIG. 2) or partially used blocks. For example, if host device 4 sends data to storage device 6 that includes only a small change from data already stored by storage device 6. The controller then may mark the old data as stale or no longer valid. Over time, this may reduce the number of erase operations blocks are exposed to, compared to erasing the block that holds the old data and writing the updated data to the same block.

Responsive to receiving a write command from host device 4, write module 24 may determine at which physical locations (blocks 17) of memory devices 16 to write the data. For example, write module 24 may request from address translation module 22 or maintenance module 26 one or more physical block addresses that are empty (e.g., store no data), partially empty (e.g., only some pages of the block store data), or store at least some invalid (or stale) data. Upon receiving the one or more physical block addresses, write module 24 may define and/or select one or more blocks, and communicate a message to channel controllers 32A-32N (collectively, "channel controllers 32"), which causes the channel controllers 32 to write the data to the blocks.

Each channel controller of channel controllers 32 may be connected to a respective channel of channels 18. In some examples, controller 8 may include the same number of channel controllers 32 as the number of channels 18 of storage device 2. Channel controllers 32 may perform the intimate control of addressing, programming, erasing, and reading of memory devices 16 connected to respective channels, e.g., under control of write module 24, read module 28, and/or maintenance module 26.

Maintenance module 26 may be configured to perform operations related to maintaining performance and extending the useful life of storage device 6 (e.g., memory devices 16). For example, maintenance module 26 may implement at least one of wear leveling or garbage collection.

Scheduling module 30 of controller 8 may perform one or more operations to schedule activities to be performed by memory devices 16. For instance, scheduling module 30 may schedule requests received from other components of controller 8 to command one or more of memory devices 16 to perform one or more activities during run-time. In some examples, scheduling module 30 may schedule the requests to be performed in the order in which they were received (e.g., first-in first-out or FIFO). In some examples, scheduling module 30 may schedule the requests based one or more factors which may include, but are not limited to, the type of request (e.g., a read request, a write request, an erase request, a garbage collection request, etc.), an amount of time elapsed since the request was received, an amount of power that would be consumed by performance of the request, bandwidth considerations, and the like.

In some examples, in addition to causing the unit of user data to be stored by memory devices 16, write module 24 may cause memory devices 16 to store information (parity data) which may be used to recover and/or validate the unit of data should one or more of the blocks fail or become corrupted. In some examples, write module 24 cause the parity data to be stored with the user data in the same physical page of a memory device of memory devices 16. For instance, address translation module 22 may implement a simple logical-to-physical address mapping scheme that may map a single physical page address to a single logical page address. An example of such a scheme is described below with reference to FIGS. 4 and 5.

In some examples, it may be desirable for write module 24 to cause more parity data to be stored for a block of user data. For instance, as memory devices 16 are used and age or age, the reliability of the memory cells of memory devices 16 may degrade. In some examples, the reliability of the memory cells of memory devices 16 may be quantified as a bit error rate (BER). As such, to improve the probability that read module 28 may successfully retrieve the block of user data, write module 24 may store larger sizes of parity data as the BER increases. As one example, where the BER is less than a threshold, write module 24 may store less parity data for each block of user data than when the BER is greater than the threshold.

However, in some examples, write module 24 may not be able to easily cause the amount of parity data stored to be larger. For instance, in examples where write module 24 causes the parity data for a block of user data to be stored with the user data in the same physical page of a memory device of memory devices 16, the size of the parity data may be limited to the difference between the size of a block of user data and the size of the physical page of the memory device. For instance, where physical page in a memory device may store 8320 bytes and the size of the block of user data is 8192 bytes, the size of the parity data may be limited to 128 bytes. This size limitation may prevent write module 24 from easily increasing the amount of parity data stored, which may not be desirable.

Figure 4:
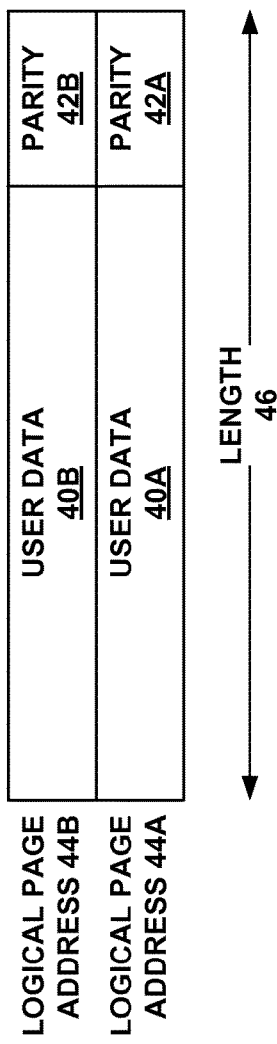
FIG. 4 is a conceptual diagram illustrating an example logical configuration of user data and corresponding parity data stored at the same page of a memory device, in accordance with one or more techniques of this disclosure.
Figure 5:
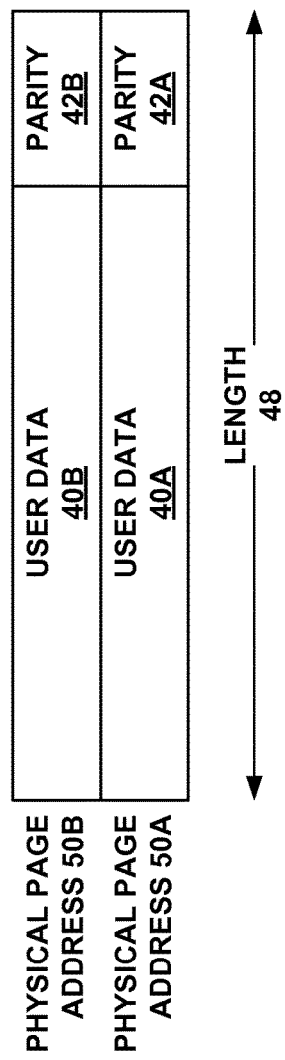
FIG. 5 is a conceptual diagram illustrating an example physical configuration of user data and corresponding parity data stored at the same page of a memory device, in accordance with one or more techniques of this disclosure.

FIG. 4 is a conceptual diagram illustrating an example logical configuration of user data and corresponding parity data stored the same page of a memory device. As illustrated in FIG. 4, user data 40A and corresponding parity data 42A may be associated with logical page address 44A, and user data 40B and corresponding parity data 42B may be associated with logical page address 44B. Length 46 may represent the combined length of the user data and the parity data at each logical page address. In some examples, user data 40A and user data 40B may each be 8192 bytes long and parity data 42A and parity data 42B may each be 128 bytes long such that the combined length of data to be stored at each logical page address may be 8320 bytes. FIG. 5 is a conceptual diagram illustrating an example physical configuration of user data and corresponding parity data stored the same page of a memory device. In some examples, physical page address 50A and physical page address 50B may respectively correspond to page 19Aa and page 19Ab of FIG. 2. Length 48 may represent maximum size of data that write module 24 may cause to be stored at each physical page address. In some examples, length 48 may be 8320 bytes.

Where the combined size of blocks of data at a logical page address is less than or equal to the maximum size of data that may be stored at each physical page address, write module 24 may cause the blocks of data at each logical page address to be written to a physical page address without rearrangement. In the example of FIGS. 4 and 5, as the combined length the blocks of data at logical page address 44A (i.e., user data 40A and parity data 42A) is less than or equal to length 48, write module 24 may cause the blocks of data at logical page address 44A to be written to physical page address 50A without rearrangement. However, in this example, it is not possible for write module 24 to increase the size of parity data 42A without the combined size of user data 40A and parity data 42A being greater than length 48. As discussed above, this limitation may not be desirable.

In some examples, write module 24 may make the size of the parity data independent of the size of physical pages of memory devices 16. For instance, write module 24 may store the user data and at least some of the parity data at different physical pages within memory devices 16. As one example, controller 8 may store a first portion of the parity data along with the user data in page 19Aa of memory device 16Aa and store a second portion of the parity data in page 19Ab of memory device 16Aa. As the second portion of the parity data is stored in a separate page of memory devices 16 than the user data, read module 28 may read both pages (e.g., page 19Aa and page 19Ab) in order to retrieve the user data. Similarly, when storing the user data, write module 24 may write to two different physical pages in memory devices 16.

In some examples, the size of the parity data stored by write module 24 may be made independent of the size of physical pages of the memory device. For instance, address translation module 22 may implement an advanced logical-to-physical address mapping scheme that may map a logical page address to multiple physical pages addresses. An example of such a scheme is described below with reference to FIGS. 6 and 7.

Figure 6:
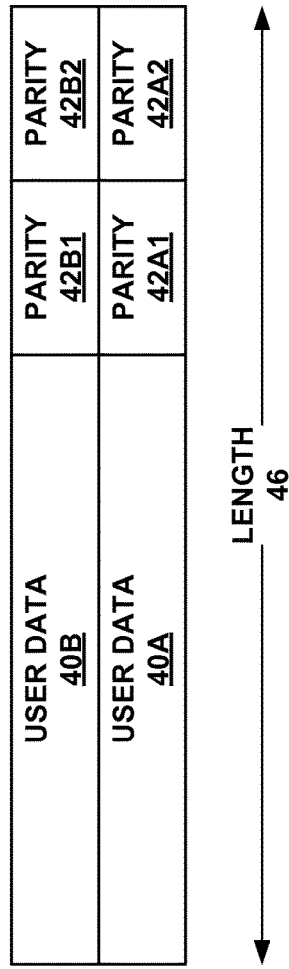
FIG. 6 is a conceptual diagram illustrating an example logical configuration of user data and at least some parity data stored at different pages of a memory device, in accordance with one or more techniques of this disclosure.
Figure 7:
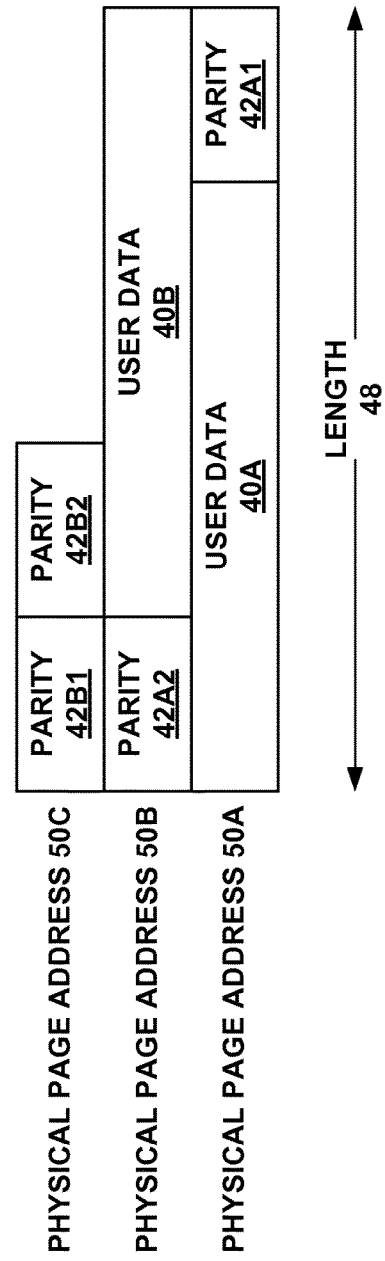
FIG. 7 is a conceptual diagram illustrating an example physical configuration of user data and at least some parity data stored at different pages of a memory device, in accordance with one or more techniques of this disclosure.

FIG. 6 is a conceptual diagram illustrating an example logical configuration of user data and at least some parity data stored at different pages of a memory device. As illustrated in FIG. 6, user data 40A and corresponding parity data 42A1 and parity data 42A2 may be associated with logical page address 44A, and user data 40B and corresponding parity data 42B1 and parity data 42B2 may be associated with logical page address 44B. Length 46 may represent the combined length of the user data and the parity data at each logical page address. In the example of FIG. 6, user data 40A and user data 40B may each be 8192 bytes long and parity data 42A1, parity data 42A2, parity data 42B1, and parity data 42B2 may each be 128 bytes long such that the combined length of data to be stored at each logical page address may be 8448 bytes. FIG. 7 is a conceptual diagram illustrating an example physical configuration of user data and at least some parity data stored at different pages of a memory device. In some examples, physical page address 50A, physical page address 50B, and physical page address 50C may respectively correspond to page 19Aa, 19Ab, and page 19Ac of FIG. 2. Length 48 may represent the maximum size of data that write module 24 may cause to be stored at each physical page address. In the example of FIG. 7, length 48 may be 8320 bytes.

As discussed above, where the combined size of blocks of data at a logical page address is less than or equal to the maximum size of data that may be stored at each physical page address, write module 24 may cause the blocks of data at each logical page address may be written to a physical page address without rearrangement. However, in the example of FIGS. 6 and 7, as the combined length the blocks of data at logical page address 44A (i.e., user data 40A, parity data 42A1, and parity data 42A2) is greater than length 48, write module 24 may cause the blocks of data at logical page address 44A to be written to multiple physical page addresses. For instance, to enable write module 24 to store the blocks of data at logical page address 44A, address translation module 22 may map logical page address 44A to all of physical page address 50A and a first portion of physical page address 50B. Similarly, to enable write module 24 to store the blocks of data at logical page address 44B, address translation module 22 may map logical page address 44B to a second portion of physical page address 50B and a first portion of physical page address 50C. Based on the mappings, write module 24 may store user data 40A and parity data 42A1 at physical page address 50A, store parity data 42A2 and user data 40B at physical page address 50B, and store parity data 42B1 and parity data 42B2 at physical page address 50C. In this way, write module 24 may store larger sizes of parity data.

As a portion of the parity data may be stored in a separate page than the user data, pages write module 24 may perform two write operations in order to store a block of user data. Similarly, read module 28 may perform two read operations in order to retrieve a block of user data. In some examples, multiple read or write operations to retrieve or store a single block of user data may not be desirable (e.g., due to increased cycle counts, reduced performance, reduced reliability, and increased read disturbance).

Hence, in some examples, instead of storing at least a portion of the parity data at a different physical page than the corresponding user data within a single memory device (e.g., a memory device of memory devices 16), write module 24 may store at least a portion of the parity data in parity memory devices 20. For instance, write module 24 may determine parity data for a block of user data, store the block of user data in memory devices 16, and store at least a portion of the parity data in parity memory devices 20. An example of such a scheme is described below with reference to FIGS. 8 and 9. In some examples, write module 24 may write the portion of the parity data to parity memory devices 20 and write the block of user data to memory devices 16 in parallel. Similarly, in some examples, read module 28 may read the portion of the parity data from parity memory device 20 and read the block of user data from memory devices 16 in parallel. In this way, write module 24 may user larger sizes of parity data without or with reduced undesirable effects (e.g., increasing cycle counts, reducing performance, reducing reliability, and increasing read disturbance).

Figure 8:
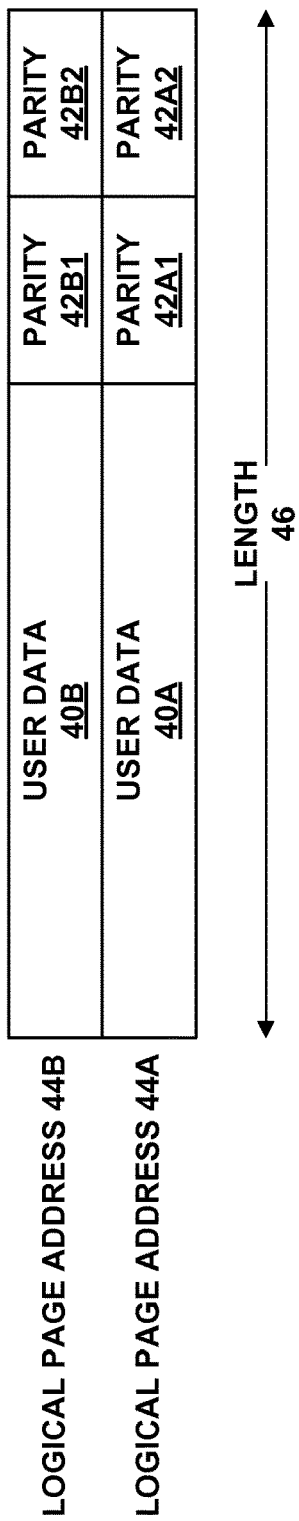
FIG. 8 is a conceptual diagram illustrating an example logical configuration of user data and at least some parity data stored at different memory devices, in accordance with one or more techniques of this disclosure.

FIG. 8 is a conceptual diagram illustrating an example logical configuration of user data and at least some parity data stored at different memory devices. As illustrated in FIG. 8, user data 40A and corresponding parity data 42A1 and parity data 42A2 may be associated with logical page address 44A, and user data 40B and corresponding parity data 42B1 and parity data 42B2 may be associated with logical page address 44B. Length 46 may represent the combined length of user data and parity data at each logical page address. In the example of FIG. 8, user data 40A and user data 40B may each be 8192 bytes long and parity data 42A1, parity data 42A2, parity data 42B1, and parity data 42B2 may each be 128 bytes long such that the combined length of data to be stored at each logical page address may be 8448 bytes.

Figure 9:
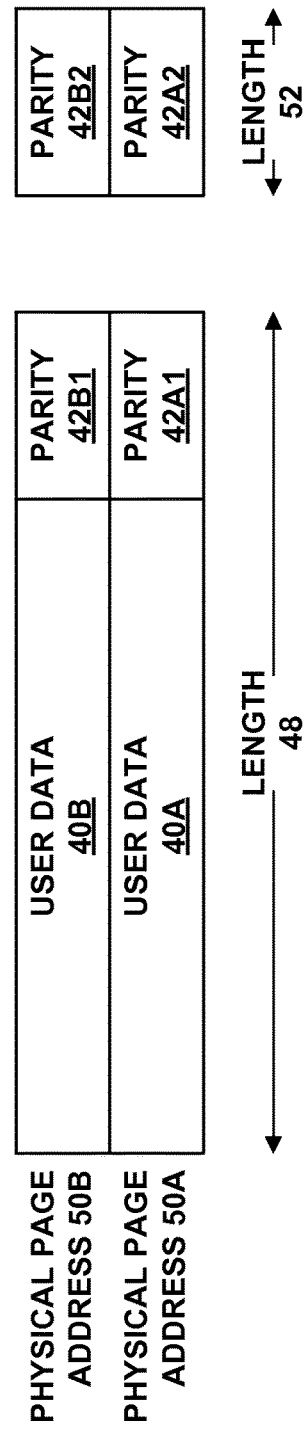
FIG. 9 is a conceptual diagram illustrating an example physical configuration of user data and at least some parity data stored at different memory devices, in accordance with one or more techniques of this disclosure.

FIG. 9 is a conceptual diagram illustrating an example physical configuration of user data and at least some parity data stored at different memory devices. In some examples, physical page address 50A, and physical page address 50B may respectively correspond to page 19Aa and page 19Ab of FIG. 2. Length 48 may represent the maximum size of data that write module 24 may cause to be stored at each physical page address of memory devices 16. In the example of FIG. 9, length 48 may be 8320 bytes. Length 52 may represent the size of parity data written to a parity memory device of parity memory devices 20.

As shown in FIG. 9, write module 24 may store at least a portion of parity data in parity memory devices 20. For instance, write module 24 may determine first parity data 42A1 and second parity data 42A2 for user data 40A. As shown in FIG. 8, user data 40A, first parity data 42A1, and second parity data 42A2 may all be associated with logical page address 44A. Address translation module 22 may provide a mapping that maps user data 40A and first parity data 42A1 to physical page address 50A of memory devices 16, which may correspond to page 19Aa of FIG. 2, and maps second parity data 42A2 to parity memory devices 20. Based on the mapping, write module 24 may cause user data 40A and first parity data 42A1 to be written to page 19Aa of memory device 16Aa of FIG. 2, and cause second parity data 42A2 to be written to parity memory devices 20.

Figure 10:
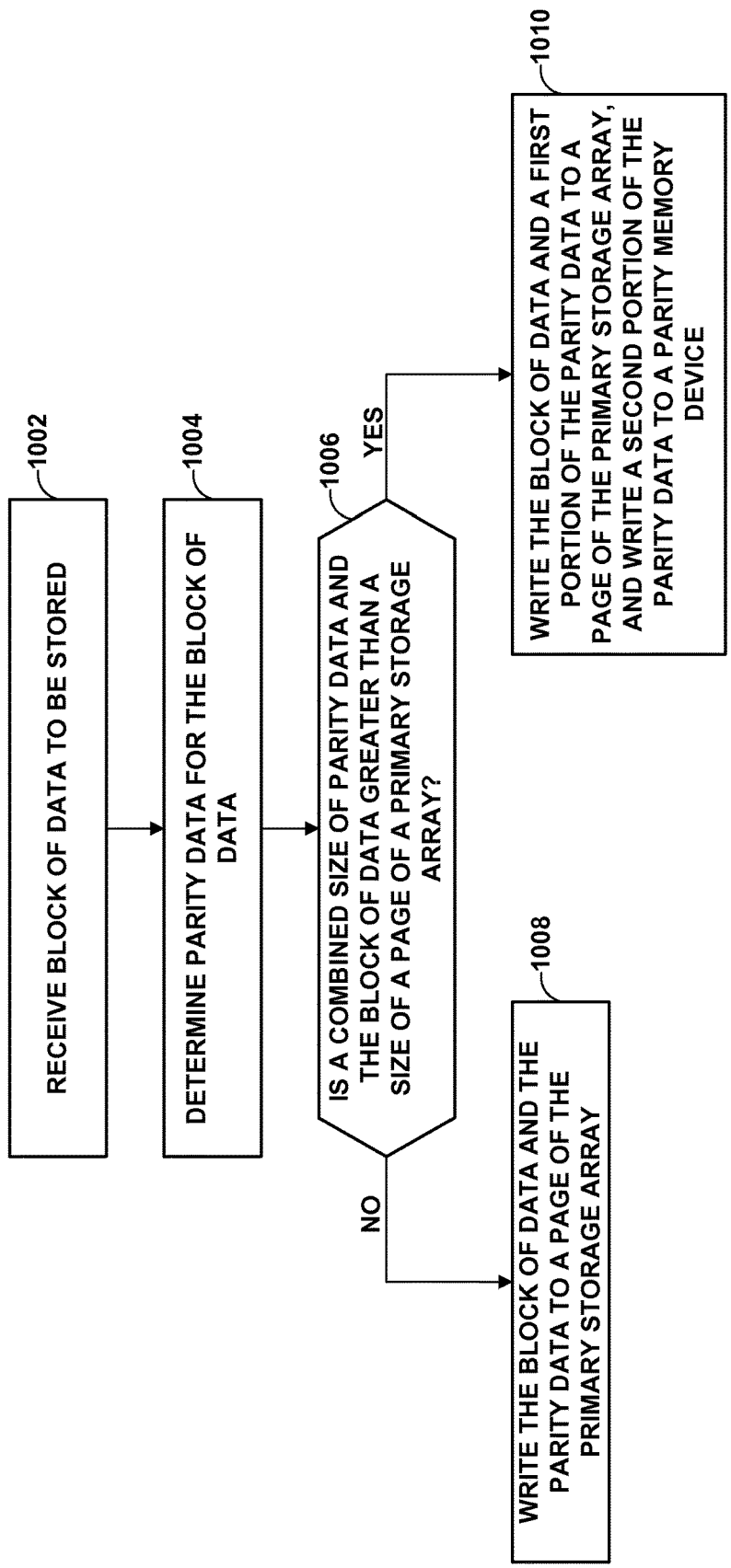
FIG. 10 is a flow diagram illustrating an example technique for storing at least some parity data in a different memory device than associate user data, in accordance with one or more techniques of this disclosure.

FIG. 10 is a flow diagram illustrating an example technique for storing parity data in a different memory device than corresponding user data, in accordance with one or more techniques of this disclosure. The technique of FIG. 10 will be described with concurrent reference to storage device 6 and controller 8 of FIGS. 1 and 3 for ease of description, although computing devices having configurations different than that of storage device 6 or controller 8 may perform the techniques of FIG. 10.

As shown in FIG. 10, controller 8 may receive a block of data to be stored (1002). For instance, write module 24 of controller 8 may receive a block of user data to be stored from host 4 of FIG. 1. Controller 8 may determine parity data for the block of data (1004). For instance, write module 24 may determine XOR parity data for the block of user data received from host device 4. In some examples, write module 24 may select a size of parity data to determine for the block of data. For instance, write module 24 may select the size of the parity data based on one or more health statistics of memory devices 16, such as a bit error rate (BER). As one example, where the BER is less than a threshold, write module 24 may select a smaller size of parity data (e.g., 128 bytes where the size of the block of data is 8192 bytes) to determine for the block of data then when the BER is greater than the threshold (e.g., 256 bytes where the size of the block of data is 8192 bytes).

Controller 8 may determine whether a combined size of the parity data and the block of data is greater than a size of a page of a primary storage array (1006). For instance, write module 24 may determine whether the combined size of the parity data and the block of data is greater than a size of a page of a memory device of memory devices 16 of non-volatile memory array 10.

If the combined size of the parity data and the block of data is not greater than a size of a page of the primary storage array ("No" branch of 1006), controller 8 may write the block of data and the parity data to a page of the primary storage array (1008). For instance, write module 24 may cause channel controller 32A to write the block of data and the parity data to page 19Aa of block 17A of memory device 16Aa of FIG. 2.

If the combined size of the parity data and the block of data is greater than a size of a page of the primary storage array ("Yes" branch of 1006), controller 8 may write the block of data and a first portion of the parity data to a page of the primary storage array, and write a second portion of the parity data to a parity memory device (1010). For instance, write module 24 may cause channel controller 32A to write the block of data and the first portion of the parity data to page 19Aa, and cause a parity memory device of parity memory devices 20 to store the second portion of the parity data. In this way, controller 8 may store at least a portion of parity data in a separate memory device than the corresponding block of data.

The above operations are only one example and other variations are contemplated. For instance, in some examples, controller 8 may not store any of the parity data in the primary storage array and may always store the parity data at the parity memory devices, regardless of the size of the parity data.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A non-transitory storage device comprising:
   a primary storage array comprising a plurality of non-volatile memory devices;
   one or more parity memory devices; and
   a controller configured to store a block of data by at least:
      writing the block of data to the primary storage array;
      determining parity data for the block of data; and
      selecting a size of parity data to determine for the block of data; and
      when a combined size of the selected size of parity data and the block of data is larger than a size of a page of the primary storage array,
         writing at least a portion of the determined parity data to the one or more parity memory devices; and
      when the combined size of the selected size of parity data and the block of data is smaller than or equal to the size of a page of the primary storage array,
         writing the at least a portion of the determined parity data to the primary storage array.

2. The non-transitory storage device of claim 1, wherein:
   to determine the parity data, the controller is configured to determine first parity data and second parity data for the block of data,
   to write the block of data to the primary storage array, the controller is configured to write the block of data and the first parity data to a page of the primary storage array, and
   to write the portion of the parity data to the one or more parity devices, the controller is configured to write the second parity data to the one or more parity devices.

3. The non-transitory storage device of claim 1, wherein the controller is further configured to retrieve the block of data by at least:
   reading the block of data from the primary storage array;
   reading the parity data from the one or more parity devices; and
   verifying the block of data based on the parity data.

4. The non-transitory storage device of claim 1, wherein the plurality of non-volatile memory devices of the primary storage array comprise a plurality of flash memory devices, and wherein the one or more parity memory devices comprise one or more magnetoresisitve random-access memory (MRAM), phase-change random-access memory (PRAM), or resistive random-access memory (ReRAM) memory devices.

5. A method comprising:
   writing, by a controller of a storage device, a block of data to a primary storage array comprising a plurality of non-volatile memory devices;
   determining, by the controller, parity data for the block of data;
   selecting a size of parity data to determine for the block of data; and
   when a combined size of the selected size of parity data and the block of data is larger than a size of a page of the primary storage array,
      writing, by the controller, at least a portion of the determined parity data to one or more parity memory devices; and
   when the combined size of the selected size of parity data and the block of data is smaller than or equal to the size of a page of the primary storage array,
      writing, by the controller, the at least a portion of the determined parity data to the primary storage array.

6. The method of claim 5, wherein:
   determining the parity data comprises determining first parity data and second parity data for the block of data,
   writing the block of data to the primary storage array comprises writing the block of data and the first parity data to a page of the primary storage array, and
   writing the portion of the parity data to the one or more parity devices comprises writing the second parity data to the one or more parity devices.

7. The method of claim 5, further comprising retrieving the block of data by at least:
   reading the block of data from the primary storage array;
   reading the parity data from the one or more parity devices; and
   verifying the block of data based on the parity data.

8. The method of claim 5, wherein the plurality of non-volatile memory devices of the primary storage array comprise a plurality of flash memory devices, and wherein the one or more parity memory devices comprise one or more magnetoresisitve random-access memory (MRAM), phase-change random-access memory (PRAM), or resistive random-access memory (ReRAM) memory devices.

9. A non-transitory computer-readable storage medium storing instructions that, when executed, cause one or more processors of a storage device to:
   write a block of data to a primary storage array comprising a plurality of non-volatile memory devices;
   determine parity data for the block of data;
   select a size of parity data to determine for the block of data;
   when a combined size of the selected size of parity data and the block of data is larger than a size of a page of the primary storage array,
      write at least a portion of the determined parity data to one or more parity memory devices; and
   when the combined size of the selected size of parity data and the block of data is smaller than or equal to the size of a page of the primary storage array,
      write the at least a portion of the determined parity data to the primary storage array.

10. The non-transitory computer-readable storage medium of claim 9, wherein:
the instructions that cause the one or more processors to determine the parity data comprise instructions that cause the one or more processors to determine first parity data and second parity data for the block of data,
the instructions that cause the one or more processors to write the block of data to the primary storage array comprise instructions that cause the one or more processors to write the block of data and the first parity data to a page of the primary storage array, and
the instructions that cause the one or more processors to write the portion of the parity data to the one or more parity devices comprise instructions that cause the one or more processors to write the second parity data to the one or more parity devices.

11. A system comprising:
a primary storage array comprising a plurality of non-volatile memory devices;
one or more parity memory devices, wherein the one or more parity memory devices are a different type of non-volatile memory device than the plurality of memory devices of the primary storage array;
means for writing a block of data to the primary storage array;
means for determining parity data for the block of data;
means for selecting a size of parity data to determine for the block of data;
means for, when a combined size of the selected size of parity data and the block of data is larger than a size of a page of the primary storage array, writing at least a portion of the determined parity data to one or more parity memory devices; and
means for, when the combined size of the selected size of parity data and the block of data is smaller than or equal to the size of a page of the primary storage array, writing at least a portion of the determined parity data to the primary storage array.

12. The system of claim 11, wherein:
the means for determining the parity data comprise means for determining first parity data and second parity data for the block of data,
the means for writing the block of data to the primary storage array comprise means for writing the block of data and the first parity data to a page of the primary storage array, and
the means for writing the portion of the parity data to the one or more parity devices comprise means for writing the second parity data to the one or more parity devices.

13. The non-transitory storage device of claim 1, wherein the plurality of non-volatile memory devices of the primary storage array comprise a plurality of flash memory devices, and wherein the one or more parity memory devices comprise one or more magnetoresisitve random-access memory (MRAM) memory devices.

14. The non-transitory computer-readable storage medium of claim 9, wherein the plurality of non-volatile memory devices of the primary storage array comprise a plurality of flash memory devices, and wherein the one or more parity memory devices comprise one or more magnetoresisitve random-access memory (MRAM), or phase-change random-access memory (PRAM) memory devices.

15. The system of claim 11, wherein the plurality of non-volatile memory devices of the primary storage array comprise a plurality of flash memory devices, and wherein the one or more parity memory devices comprise one or more phase-change random-access memory (PRAM) memory devices.

* * * * *